(12) United States Patent
Zhao (10) Patent No.: US 11,211,268 B2
(45) Date of Patent: Dec. 28, 2021

(54) DEADLOCK DETERMINATION METHOD AND SEMICONDUCTOR APPARATUS

(71) Applicant: BEIJING NAURA MICROELECTRONICS EQUIPMENT CO., LTD., Beijing (CN)

(72) Inventor: Junxiang Zhao, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 17/350,900

(22) Filed: Jun. 17, 2021

(65) Prior Publication Data

US 2021/0313203 A1    Oct. 7, 2021

Related U.S. Application Data (63) Continuation of application No. PCT/CN2019/126274, filed on Dec. 18, 2019.

(30) Foreign Application Priority Data

Dec. 20, 2018    (CN) .......................... 201811567168.5

(51) Int. Cl.
*H01L 21/67*    (2006.01)
*H01L 21/677*    (2006.01)
*G05B 19/418*    (2006.01)

(52) U.S. Cl.
CPC .. *H01L 21/67161* (2013.01); *G05B 19/41865* (2013.01); *H01L 21/677* (2013.01);
(Continued)

(58) Field of Classification Search
CPC ......... H01L 21/67161; H01L 21/67184; H01L 21/67201; H01L 21/67276; H01L 21/677;
(Continued)

(56) References Cited

U.S. PATENT DOCUMENTS

| | | | |
|---|---|---|---|
| 5,444,632 A | * | 8/1995 | Kline ...................... H01L 22/20 700/100 |
| 5,801,945 A | * | 9/1998 | Comer ............. G05B 19/41865 700/100 |

(Continued)

FOREIGN PATENT DOCUMENTS

| | | |
|---|---|---|
| CN | 101607634 A | 12/2009 |
| CN | 102814813 A | 12/2012 |
| CN | 108363362 A | 8/2018 |

OTHER PUBLICATIONS

World Intellectual Property Organization (WIPO) International Search Report for PCT/CN2019/126274 dated Mar. 25, 2020 6 Pages (including translation).

(Continued)

*Primary Examiner* — Ronald D Hartman, Jr.
(74) *Attorney, Agent, or Firm* — Anova Law Group, PLLC (57) ABSTRACT

A deadlock determination method includes constructing a new WRG and determining a deadlock. At least a process step that includes a plurality of resources is selected from process steps in a WRG that supports transporting a single piece of material. The plurality of resources corresponding to the selected process step are combined. A total capacity of each of the process steps is changed according to a combination result to construct the new WRG that supports transporting a plurality of pieces of material. The plurality of resources include apparatuses for performing the process steps. The total capacity is a sum of a number of workstations of resources corresponding to each process step. Deter- (Continued)

---

New wait relation graph (WRG) construction step, select at least one process step that includes a plurality of resources from all process steps in a WRG that supports transporting a single piece of material, combine the plurality of resources corresponding to the at least one process step, and change a total capacity of each of all the process steps according to a combination result to construct the new WRG that supports transporting a plurality of pieces of material

↓

Deadlock determination step, determine whether a material scheduling deadlock occurs based on the new WRG mining a deadlock includes determining whether a piece of material scheduling deadlock occurs based on the new WRG. The plurality of resources include apparatuses for performing the process steps.

19 Claims, 6 Drawing Sheets

(52) U.S. Cl.
CPC .. *H01L 21/67184* (2013.01); *H01L 21/67201* (2013.01); *H01L 21/67276* (2013.01); *G05B 2219/32229* (2013.01); *G05B 2219/34336* (2013.01)

(58) Field of Classification Search
CPC .... G05B 19/41865; G05B 2219/32229; G05B 2219/34336
See application file for complete search history.

(56) References Cited

U.S. PATENT DOCUMENTS

| | | | | |
|---|---|---|---|---|
| 6,122,566 | A * | 9/2000 | Nguyen | H01L 21/67167 438/908 |
| 6,336,204 | B1 * | 1/2002 | Jevtic | H01L 21/67276 414/936 |
| 6,418,350 | B1 * | 7/2002 | Hamidzadeh | G05B 19/41865 700/100 |
| 6,466,835 | B1 | 10/2002 | Ishizawa et al. | |
| 6,519,498 | B1 * | 2/2003 | Jevtic | G05B 19/41865 700/101 |
| 9,333,645 | B1 * | 5/2016 | Wu | G06F 30/22 |
| 2003/0130756 | A1 * | 7/2003 | Baweja | G06Q 10/06 700/100 |
| 2003/0236585 | A1 * | 12/2003 | Kao | G05B 19/41865 700/108 |
| 2006/0259173 | A1 * | 11/2006 | Chin | G05B 19/41865 700/99 |
| 2008/0071405 | A1 * | 3/2008 | Liu | G03F 7/70508 700/108 |
| 2008/0118142 | A1 * | 5/2008 | Chang | G05B 23/0267 382/144 |
| 2009/0319073 | A1 * | 12/2009 | Zhang | G05B 19/41865 700/112 |
| 2016/0147219 | A1 * | 5/2016 | Siddiqui | G05B 19/41865 700/101 |
| 2017/0031347 | A1 * | 2/2017 | Chaukwale | G05B 15/02 |
| 2017/0083000 | A1 * | 3/2017 | Wu | G05B 19/41865 |
| 2018/0081336 | A1 * | 3/2018 | Wu | G05B 19/41815 |

OTHER PUBLICATIONS

Zhonghua Huang:"Deadlock-free scheduling and control for automated manufacturing systems", China Doctoral Dissertations Full-text Database (Information Science & Technology), Apr. 15, 2007, China.

* cited by examiner

FIG. 1

New wait relation graph (WRG) construction step, select at least one process step that includes a plurality of resources from all process steps in a WRG that supports transporting a single piece of material, combine the plurality of resources corresponding to the at least one process step, and change a total capacity of each of all the process steps according to a combination result to construct the new WRG that supports transporting a plurality of pieces of material Deadlock determination step, determine whether a material scheduling deadlock occurs based on the new WRG

DEADLOCK DETERMINATION METHOD AND SEMICONDUCTOR APPARATUS

CROSS-REFERENCES TO RELATED APPLICATIONS

This application is a continuation of International Application No. PCT/CN2019/126274, filed on Dec. 18, 2019, which claims priority to Chinese Application No. 201811567168.5 filed on Dec. 20, 2018, the entire contents of all of which are incorporated herein by reference.

TECHNICAL FIELD

The present disclosure generally relates to the semiconductor technology field and, more particularly, to a deadlock determination method and a semiconductor apparatus that implements the deadlock determination method.

BACKGROUND

Due to a parallel path and resource sharing problem in a clustering apparatus in the semiconductor field, if a piece of material is scheduled too fast or a scheduling sequence is unreasonable, a scheduling deadlock may occur in the scheduling system of the cluster apparatus. Specifically, the deadlock refers to an impasse caused by competition for resources during operation of multiple processes. Under this situation, if there is no external force, the multiple processes are not able to be moved forward. For example, a regular cluster apparatus includes three process chambers, and each of the three process chambers includes two workstations. The regular cluster apparatus also includes a vacuum transportation robot. The vacuum robotic manipulator includes two arms. Each of the two arms includes two fingers, that is, each arm may pick and place two materials from the process chamber simultaneously. For the cluster apparatus, three process chambers are all full of the materials, and four materials at the two arms of the vacuum transportation robot are waiting to be transported to the process chamber. As such, the scheduling deadlock occurrence causes the entire scheduling system to be paralyzed to affect productivity.

A deadlock determination method can be used to avoid the deadlock. However, the current deadlock determination is only suitable for the apparatus that is configured to transport one piece of material in a single step and is not suitable for the apparatus that is configured to transport a plurality pieces of materials in a single step.

SUMMARY

Embodiments of the present disclosure provide a deadlock determination method. The method includes constructing a new WRG and determining a deadlock. At least a process step that includes a plurality of resources is selected from process steps in a WRG that supports transporting a single piece of material. The plurality of resources corresponding to the selected process step are combined. A total capacity of each of the process steps is changed according to a combination result to construct the new WRG that supports transporting a plurality of pieces of material. The plurality of resources include apparatuses for performing the process steps. The total capacity is a sum of a number of workstations of resources corresponding to each process step. Determining a deadlock includes determining whether a piece of material scheduling deadlock occurs based on the new WRG. The plurality of resources include apparatuses for performing the process steps. The total capacity is a sum of a number of workstations of resources corresponding to each process step.

Embodiments of the present disclosure provide a semiconductor apparatus including a loadport, an loadlock (LL) chamber, a process chamber, an atmosphere transport robot (ATR), a vacuum transportation robot (VTR), and a deadlock determination device. The ATR is configured to transport a piece of material between the loadport and the LL chamber and transport at least one piece of material in a single step. The VTR is configured to transport the piece of material between the LL chamber and the process chamber and transport at least one piece of material in a single step. The deadlock determination device is configured to construct a new WRG and determine a deadlock, whether a piece of material scheduling deadlock has occurred being determined based on the new WRG. At least a process step that includes a plurality of resources is selected from process steps in a WRG that supports transporting a single piece of material. The plurality of resources corresponding to the selected process step are combined. A total capacity of each of the process steps is changed according to a combination result to construct the new WRG that supports transporting a plurality of pieces of material. The plurality of resources include apparatuses for performing the process steps. The total capacity is a sum of a number of workstations of resources corresponding to each process step.

DETAILED DESCRIPTION OF THE EMBODIMENTS

To make those of ordinary skill in the art better understand the technical solutions of the present disclosure, a deadlock determination method provided by the present disclosure is described in detail below in connection with the accompanying drawings.

Figure 1:
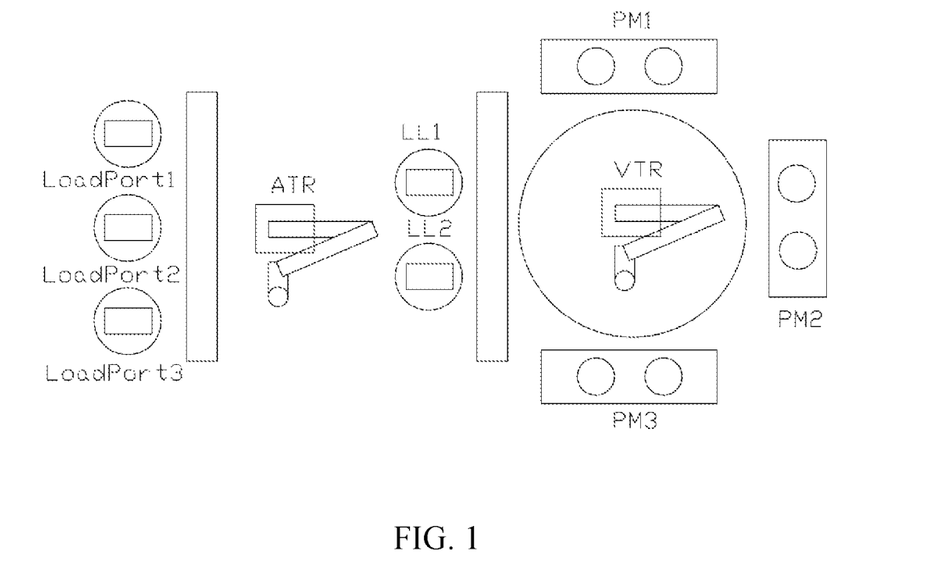
FIG. 1 illustrates a schematic structural diagram of a semiconductor apparatus according to some embodiments of the present disclosure.

Referring to FIG. 1, a semiconductor apparatus provided by embodiments of the present disclosure includes three loadports (1~3). Each loadport includes a plurality of workstations, for example, 25 workstations. The semiconductor apparatus also includes one atmosphere transport robot (ATR). The ATR is configured to transport a piece of material between a loadport and a loadlock (LL) chamber. The ATR includes two arms that may transport a piece of material in a single step. That is, the ATR includes two arms, each of the two arms includes a finger.

The semiconductor apparatus also includes four LL chambers (four LL chambers referring to LL1~LL4, respectively). FIG. 1 only shows two LL chambers (LL1, LL2). The other two LL chambers (LL3, LL4) are located under the LL chambers (LL1~LL2). Each two LL chambers (upper layer LL chamber and lower layer LL chamber) form a chamber group. Each of the four LL chambers includes a workstation.

The semiconductor apparatus also includes a vacuum transportation robot (VTR). The VTR is configured to transport a piece of material between a LL chamber and a process chamber. The VTR includes two arms that each of the two arms may transport two pieces of material in a single step. That is, the VTR includes two arms, and each of the two arms includes two fingers.

The semiconductor apparatus also includes three process chambers (PM1~PM3). Each of the three process chambers includes two workstations.

The workstations may refer to locations for placing pieces of material in the apparatus of the process steps. Each workstation may be configured to accommodate one piece of material.

The semiconductor apparatus may transport a piece of material in a single step, or transport more than two pieces of material in a single step. The semiconductor apparatus includes apparatuses for performing the process steps. An apparatus may be referred to as a resource. That is, the resource may include an apparatus of a VTR, a LL chamber, or a process chamber.

The deadlock determination method provided by embodiments of the present disclosure may be performed based on the semiconductor apparatus. However, the present disclosure is not limited to this. In practical applications, the deadlock determination method provided by embodiments of the present disclosure may be used to determine the deadlock of the semiconductor apparatus that transports one piece of material or more than two pieces of materials in a single step.

Figure 2:
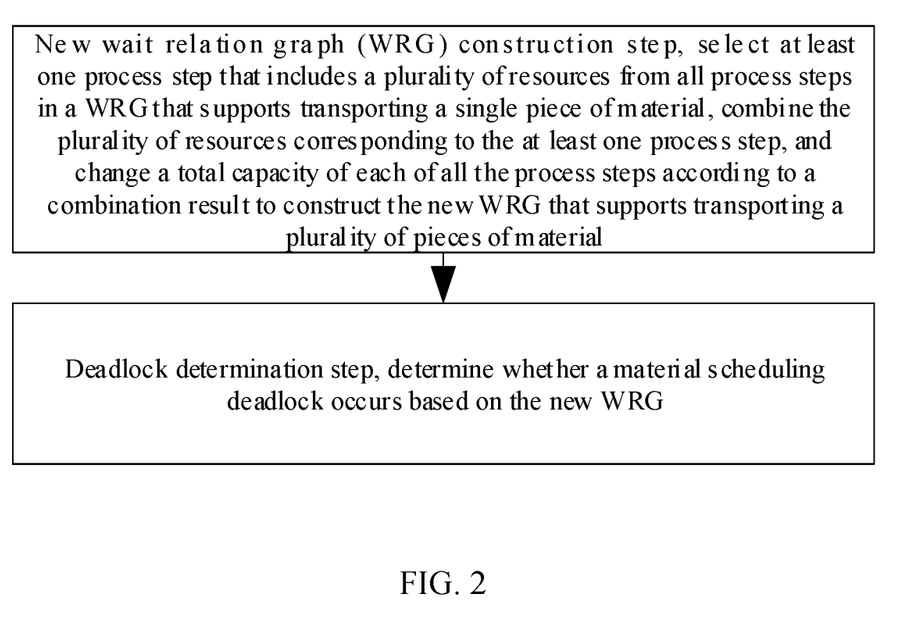
FIG. 2 illustrates a schematic flowchart of a deadlock determination method according to some embodiments of the present disclosure.

In some embodiments, referring to FIG. 2, the deadlock determination method includes a new wait relation graph construction step. For a wait relation graph (WRG, abbreviation G) that supports transporting a single piece of material, at least one process step including a plurality of resources of all process steps may be selected. The plurality of resources corresponding to the selected process step may be combined, and a total capacity of each of the process steps may be changed according to a combined result to construct a new WRG that supports transporting a plurality of pieces of material.

The deadlock determination method further includes a deadlock determination step. The deadlock determination step is to determine whether a piece of material scheduling deadlock has occurred based on the new WRG.

In some embodiments, in the new WRG construction step, a number R of resources corresponding to the selected process step may be combined into one resource, and a total capacity of each of the process steps may be changed, to cause $C_{new}=C_{old}/R$. R is the number of the resources corresponding to a same process step, and R is an integer greater than or equal to 2. $C_{new}$ is the total capacity of the process steps after the resources are combined. $C_{old}$ is the total capacity of the process steps before the resources are combined. The total capacity is a sum of the number of the workstations of all resources corresponding to the process steps.

The WRG includes a resource collection (one resource r corresponding to each of the process steps) and a wait relation side collection. Each piece of material may be processed according to a preset path. In the path, transporting the piece of material from one resource to another resource may be represented by a wait relation side, for example, the wait relation side from resource $r_1$ to resource $r_2$ may be represented by:

$$a=r_1 r_2.$$

Figure 3A:
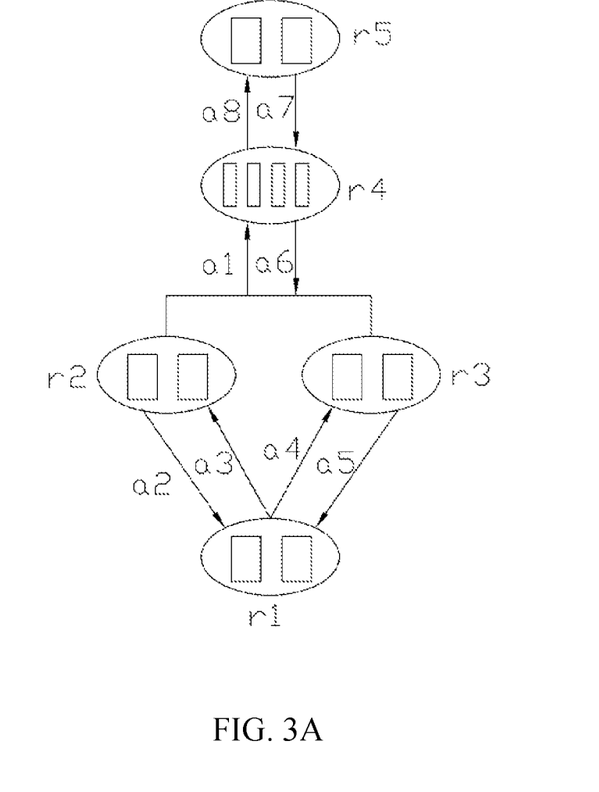
FIG. 3A illustrates a schematic wait relation graph (WRG) before resources are combined according to some embodiments of the present disclosure.

In some embodiments, a WRG for supporting transporting a single piece of material shown in FIG. 3A is taken as an example to describe the deadlock determination method provided by embodiments of the present disclosure in detail. In some embodiments, the WRG shown in FIG. 3A is before the resources are combined. The process includes four steps, from a first step to a fourth step, respectively. An apparatus for performing the first step includes the ATR that can transport two pieces of material simultaneously. The ATR corresponds to a resource r1, and the total capacity of the first step is 2. An apparatus for performing the second step includes two chamber groups, each chamber group includes two LL chambers. The two chamber groups correspond to two resources (r2, r3) of the same process step. The capacity of each chamber group is 2. Thus, the total capacity of the second step is 4. An apparatus for performing the third step includes a VTR, which can transport four pieces of material simultaneously. The VTR corresponds to a resource r4, and the total capacity of the third step is 4. An apparatus for performing the fourth step includes a reaction chamber. The reaction chamber corresponds to a resource r5. The total capacity of the fourth step is 2.

In the above-mentioned WRG, the piece of material transfer path is:

$$r_1 \rightarrow (r_2/r_3) \rightarrow r_4 \rightarrow r_5 \rightarrow r_4 \rightarrow (r_2/r_3) \rightarrow r_1.$$

Figure 3B:
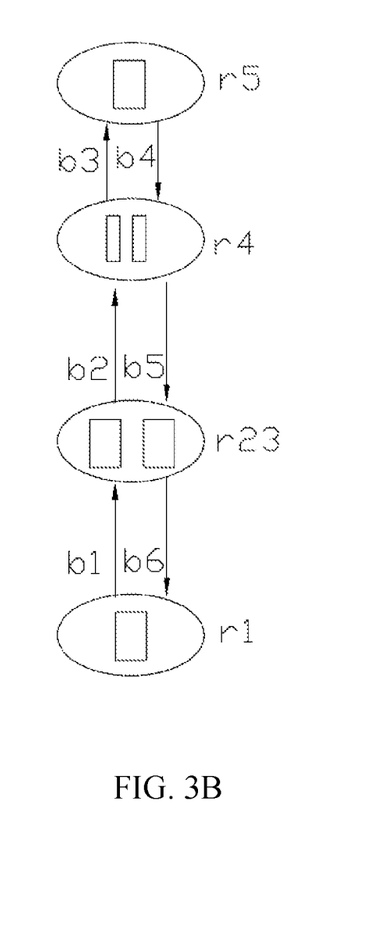
FIG. 3B illustrates a schematic WRG after the resources are combined according to some embodiments of the present disclosure.

Referring to FIG. 3B, in the new WRG construction steps of the deadlock determination method provided by embodiments of the present disclosure, at least one process step including the number R of resources may be selected from the WRG. The number R of resources of the selected process step may be combined into one resource, the total capacity of each process step may be changed, and $C_{new}/C_{old}$ R.

In some embodiments, the second step corresponds to two resources $(r_2, r_3)$. The two resources $(r_2, r_3)$ may be seen as one resource $r_{23}$. That is, the two resources $(r_2, r_3)$ corresponding to the second step may be combined into one resource $r_{23}$. Then, the total capacity of each process step may be changed, and $C_{new}=C_{old}/R$. That is, the total capacities of the first step to the fourth step are halved. As such, a new WRG that supports transporting the two pieces of material may be constructed, which is shown in FIG. 3B.

The reason for halving the total capacity of each process step is as follows. As shown in FIG. 3A, a sub-path $a_1$ is represented by $(r_2/r_3) \rightarrow r_4$, and two pieces of material may be moved simultaneously. If each of the resource $r_2$ and the resource $r_3$ includes a piece of material, and after the piece of material enters the resource $r_4$, the piece of material may take two workstations of the resource $r_4$ after completing the sub-path $a_1$, and the resource $r_2$ and the resource $r_3$ both may release one workstation. Therefore, in the new WRG, a number of vacant workstations of the resource $r_4$ may be halved, and the total capacity of the third step may be halved. A number of vacant workstations may be equal to a number of workstations of the resource $r_2$ or the resource $r_3$. The total capacity (a sum of a number of workstations of the resource $r_2$ and resource $r_3$) of the second step may be halved. Sub-paths $a_2 \sim a_5$ represent movements of a piece of material between $r_1$ and $r_2$ and between $r_1$ and $r_3$. For the new WRG, sub-path $a_6$ represents $r_{23} \rightarrow r_1$. One time of movement may be equivalent to two times of movement of the actual apparatus, that is, $r_2 \rightarrow r_1$ and $r_3 \rightarrow r_1$. Therefore, the total capacity of the first step may be halved. Thus, compared to the original WRG, each process step of the new WRG may be halved.

If only one piece of material in the resource $r_2$ and the resource $r_3$ is going to enter the resource $r_4$, and no piece of material in the resource $r_1$ corresponding to the first step enters the resource $r_2$ or the resource $r_3$, when the piece of material completes the sub-path $a_1$, the piece of material may take one workstation of the resource $r_4$. However, based on the new WRG, the piece of material may still take two workstations of the resource $r_4$, and each of the resource $r_2$ and the resource $r_3$ may release one workstation simultaneously. Therefore, the situation is also suitable for the new WRG.

The new WRG that supports two-step transportation constructed based on the new WRG construction step may determine whether deadlock has occurred for the semiconductor apparatus of transferring two pieces of material in a single step.

In some embodiments, the number R of resources corresponding to the selected process steps may be combined into a resource. The total capacities of the process steps may be halved. However, the present disclosure is not limited to this. In the practical applications, another combination manner may be used according to different WRGs, and the total capacities of the process steps may be changed adaptively.

In some embodiments, after the new WRG construction step, and before the deadlock determination step, the method further includes:
  determining whether a current status of the piece of material is suitable for a situation of requiring to perform the material scheduling deadlock determination;
  if the current status of the piece of material is suitable, performing the deadlock determination step; and
  if the current status of the piece of material is not suitable, simulating moving the piece of material from the current process step to a next process step, to cause the status of the piece of material after the movement to be suitable for the situation of requiring to perform the piece of material scheduling deadlock determination, and then performing the deadlock determination step.

Simulating moving the piece of material refers to that the current process of the piece of material is considered to be moved to the next process step. In reality, the current process of the piece of material is still not moved to the next process step.

According to the different current statuses of the piece of material, the scheduling system may not deadlock, then the material scheduling deadlock determination may not need to be performed. However, when the piece of material enters the next process step, the scheduling system may deadlock, and thus, the deadlock determination step may need to be performed. Based on this, when the piece of material is in a status corresponding to the situation that the scheduling system certainly does not deadlock, the deadlock determination step may be performed by simulating moving the piece of material to the next process step.

By taking the semiconductor apparatus shown in FIG. 1, a situation of the piece of material taking the workstations of the resources includes the following situations.

In a first situation, the resource $r_1$ corresponding to the first step includes no piece of material or a piece of material. Both of the two resources $r_2$ and $r_3$ corresponding to the second step include a piece of material, and the semiconductor apparatus waits to enter the third step.

In a second situation, the resource $r_1$ corresponding to the first step includes no piece of material or a piece of material. Both of the two resources $r_2$ and $r_3$ corresponding to the second step include a piece of material, and the semiconductor apparatus waits to enter the first step.

In a third situation, the resource $r_1$ corresponding to the first step has no piece of material or two pieces of material. Both of the two resources $r_2$ and $r_3$ corresponding to the second step include no piece of material.

In a fourth situation, the resource $r_1$ corresponding to the first step includes no piece of material or two pieces of material. The first resource $r_2$ corresponding to the second step includes no piece of material. The second resource $r_3$ corresponding to the second step includes a piece of material, and the semiconductor apparatus waits to enter the first step or the third step.

The above four situations all match the situation that requires performing the material scheduling deadlock determination. In addition to the four situations, the situation of the piece of material taking the workstations of the resource further includes the following situations.

In a fifth situation, the resource $r_1$ corresponding to the first step includes a piece of material, and the piece of material waits to enter the first resource $r_2$ corresponding to the second step. The first resource $r_2$ corresponding to the second step includes no piece of material. The second resource $r_3$ corresponding to the second step includes a piece of material, and the piece of material waits to enter the third step.

In a sixth situation, the resource $r_1$ corresponding to the first step includes a piece of material, and the piece of material waits to enter the second resource $r_3$ corresponding to the second step. The second resource $r_3$ corresponding to the second step includes no piece of material. The first resource $r_2$ corresponding to the second step includes a piece of material, and the material waits to enter the third step.

In a seventh situation, the resource $r_1$ corresponding to the first step includes a piece of material, and the piece of material is located at an end of the path from the second step to the first step, that is, an endpoint of $a_5$. The second resource $r_3$ corresponding to the second step includes no piece of material. The first resource $r_2$ corresponding to the second step includes a piece of material, and the piece of material waits to enter the first step.

In an eighth situation, the resource $r_1$ corresponding to the first step includes a piece of material, and the piece of material is located at an end of the path from the second step to the first step, that is, an endpoint of $a_5$. The first resource $r_2$ corresponding to the second step includes no piece of material. The second resource $r_3$ corresponding to the second step includes a piece of material, and the piece of material waits to enter the first step.

No piece of material scheduling deadlock will be in these four situations (the fifth situation to the eighth situation). The status of the piece of material may be converted to the foregoing situations (the first situation to the fourth situation) by simulating any one step of moving the piece of material to cause the status of the piece of material to be converted into a situation that requires to perform the material scheduling deadlock determination.

For example, if the situation of the piece of material taking the workstations matches the fifth situation, the piece of material in the first step may be transported to the second resource $r_3$ corresponding to the second step. If the situation of the piece of material taking the workstations matches the sixth situation, the piece of material in the first step may be transported to the first resource $r_2$ corresponding to the second step. If the situation of the piece of material taking the workstations matches the seventh situation, the piece of material in the second resource $r_3$ corresponding to the second step may be transported to the first step. If the situation of the piece of material taking the workstations matches the eighth situation, the piece of material in the first resource $r_2$ corresponding to the second step may be transported to the first step.

In some embodiments, the method further includes, after the deadlock determination step:

if the material scheduling deadlock has occurred, ending the process; and if the material scheduling deadlock does not occur, simulating moving the piece of material to cause the process step to move to the next process step, and returning to the step of determining whether the current status of the piece of material matches the situation that requires to perform the material scheduling deadlock determination.

By taking the new WRG shown in FIG. 3B as an example, embodiments of the deadlock determination step are described in detail. In some embodiments, the deadlock determination step includes the following steps.

At step 101, all simple loops are obtained from the new WRG.

One step in the material transportation path may be represented by one or a plurality of wait relation sides. The plurality of wait relation sides may represent parallel paths. The WRG may be divided into a plurality of sub-graphs. In any two resources of a sub-graph, if two paths exist from the first resource to the second resource and from the second resource to the first resource, the sub-graph may be a loop. If the loop does not include another loop, the loop is a simple loop.

At step 102, all selection loops are obtained from the new WRG to form a selection loop collection. An attribute flag of the selection loop is non-Broken.

If any one process step includes a plurality of wait relation sides, the plurality of wait relation sides are parallel paths. If the simple loop includes any one wait relation side of the parallel paths, the simple loop is the selection loop.

For example, the WRG shown in FIG. 3A includes parallel paths $r_1 \to r_2$ and $r_1 \to r_3$ and a simple loop $C_1$ ($r_1 \to r_2 \to r_4 \to r_1$) and a simple loop $C_2$ ($r_1 \to r_3 \to r_5 \to r_1$). The simple loop $C_1$ includes the path $r_1 \to r_2$, and the simple loop $C_2$ includes the path $r_1 \to r_3$. If another loop does not include the two parallel paths, the WRG only includes the two simple loops. The combination of the two simple loops may be referred to as a selection loop.

At step 103, whether the attribute flags of all the simple loops are Broken or non-Broken are determined.

At step 104, all simple loops with the attribute flag of non-Broken and all the selection loops are formed a first loop collection.

At step 105, a number M of loops in the first loop collection may be combined to form a second loop collection, which includes a number N of loops, $N = C_M^1 + C_M^2 + \ldots + C_M^M$.

At step 106, whether the second loop collection includes a situation that the loop $C_1$ includes another loop $C_2$ is determined. If the situation is included, the another loop $C_2$ included in the loop $C_1$ is deleted, and the loops that are not deleted in the second loop collection form a third loop collection.

At step 107, a number of vacant workstations Slack of the resource and a total number of nodes are obtained based on loop information in the third loop collection. In a plurality of loops that are connected to each other, a resource at a connection includes a workstation, and the connection is a node.

In some embodiments, step 107 includes obtaining the loop information from the third loop collection, the loop information including a total number (Capacity) of workstations of the resource and a number (Commit) of workstations of the resource that are taken (1071), obtaining a vacant workstation number (Slack) by calculating a difference between the Capacity and the Commit of the resource (1072), and searching nodes in the third loop collection and calculating a total number of nodes ΣO (node).

At step 108, a difference between the Slack and the ΣO (node) is calculated, and whether the difference is greater than zero is determined. If the difference is greater than zero, the material scheduling deadlock does not occur. If the difference is smaller than or equal to zero, the material scheduling deadlock would occur.

According to the above, whether the material scheduling deadlock would occur may be determined based on the new WRG, which determines whether the deadlock occurs in the semiconductor apparatus that transports a plurality of pieces of material in a single step.

In the deadlock determination method provided by embodiments of the present disclosure, a semiconductor apparatus that transports three pieces of material in a single step is taken as an example for performing deadlock determination. A specific structure of the semiconductor apparatus refers still to the semiconductor apparatus shown in FIG. 1.

Figure 4A:
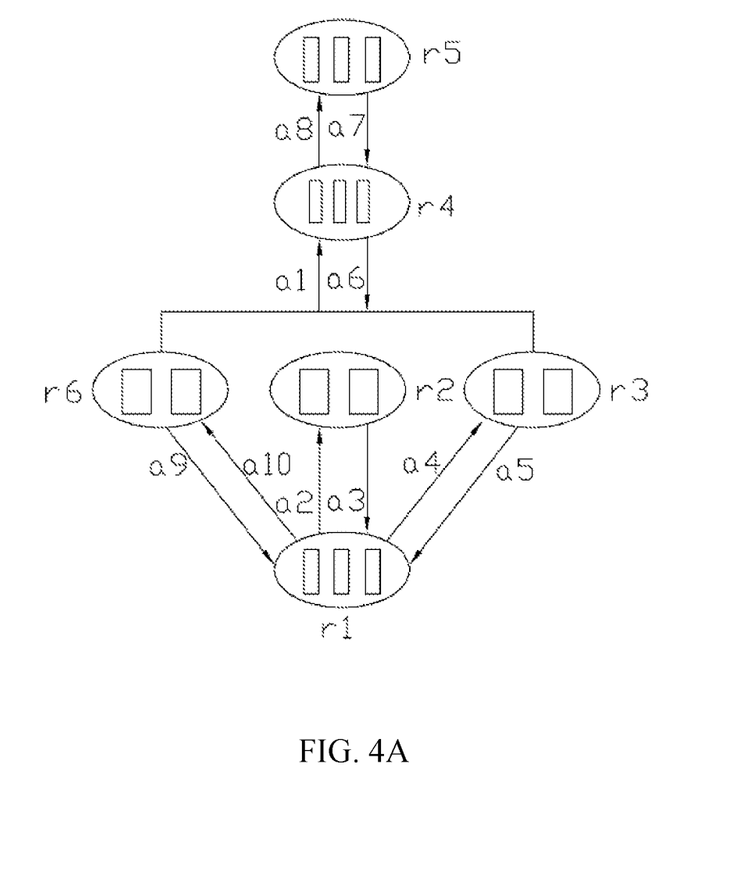
FIG. 4A illustrates a schematic WRG before resources are combined according to some other embodiments of the present disclosure.

Referring to FIG. 4A, before the resources are combined, in a WRG that supports transporting of a single piece of material, four process steps are included, that is, a first step to a fourth step. An apparatus for performing the first step includes an ATR that can transport three pieces of material simultaneously. The first step corresponds to a resource $r_1$, and the total capacity of the first step is three. An apparatus for performing the second step includes three chamber groups. Each of the three chamber groups includes two LL chambers. The three chamber groups are three resources ($r_2$, $r_3$, $r_6$) corresponding to a same process step. The capacity of each of the three chamber groups is three. Thus, the total capacity of the second step is six. An apparatus for performing the third step includes a VTR that can transports three pieces of material simultaneously. A resource corresponding to the third step is $r_4$, and a total capacity of the third step is three. An apparatus for performing the fourth step includes a reaction chamber. A resource corresponding to the fourth step is $r_5$, and a total capacity of the fourth step is three.

Figure 4B:
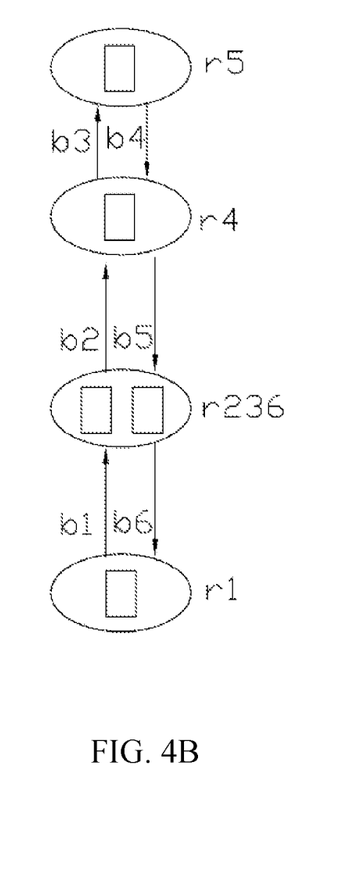
FIG. 4B illustrates a schematic WRG after the resources are combined according to some other embodiments of the present disclosure.

Referring to FIG. 4B, in the new WRG construction step of the deadlock determination method provided by embodiments of the present disclosure, at least a process step that includes a number R of resources is selected in FIG. 4B. The number R of resources of the selected process step are combined into one resource. The total capacity of each process step is changed to cause $C_{new} = C_{old}/R$.

In some embodiments, the second step corresponds to three resources ($r_2$, $r_3$, $r_6$). Under this situation, the three resources ($r_2$, $r_3$, $r_6$) may be seen as one resource $r_{236}$, that is, the three resources ($r_2$, $r_3$, $r_6$) corresponding to the second step in the WRG that supports transporting a single piece of material may be combined into the resource $r_{236}$. Meanwhile, the total capacity of each process step is changed to cause $C_{new} = C_{old}/R$, that is, the total capacities of the first step to the fourth step are halved. In some embodiments, the total capacity of the first step may be changed to 1. The total capacity of the second step may be changed to 2. The total capacity of the third step may be changed to 1. The total capacity of the fourth step may be changed to 1. As such, a new WRG that supports transporting three pieces of material is constructed.

According to the above, the deadlock determination method provided by the present disclosure may be suitable for the deadlock determination of the semiconductor apparatuses that are configured to transport one, two, three, or more pieces of material.

As another technical solution, the present disclosure further provides a semiconductor apparatus. The semiconductor apparatus includes a loadport, an LL chamber, a process chamber, an ATR, a VTR, and a deadlock determination device.

In some embodiments, three loadports are included. Each of the three loadports may include a plurality of workstations, for example, 25 workstations. The LL chamber may be referred to as a transition chamber. A number N of LL chambers may be included. Each LL chamber includes a workstation. In practical applications, each two LL chambers may form a chamber group. Two LL chambers in a same chamber group are arranged at an upper layer and a lower layer. As such, the number N of LL chambers may be divided into a number N/2 of chamber groups. N is an even number greater than or equal to 4. For example, by taking the semiconductor apparatus shown in FIG. 1 as an example, N is equal to 4. In some embodiments, N may be equal to 6.

The ATR may be configured to transport the piece of material between the loadport and the LL chamber. The ATR may include a number N/2 of arms that can transport a piece of material in a single step. The number N/2 of arms may transport the pieces of material to an LL chamber of the number N/2 chamber groups simultaneously. For example, when four LL chambers are includes, the ATR includes two arms. Thus, the ATR may perform material pick-up operation and material placement operation on one LL chamber (the upper layer chamber or the lower layer chamber) of the two chamber groups simultaneously. For another example, when six LL chambers are included, the ATR includes three arms. Thus, the ATR may perform the material pick-up operation and the material placement operation on one LL chamber (the upper layer chamber or the lower layer chamber) of the three chamber groups simultaneously.

The VTR may be configured to transport the piece of material between the LL chamber and the process chamber. The VTR may include two arms that can transport a number N/2 of pieces of material in a single step to complete material pick up operation and material placement operation of the process chamber. For example, when four LL chambers are included, the VTR includes two arms, and each of the two arms can transport two pieces of material in a single step. For another example, when six LL chambers are included, the VTR includes two arms, and each of the two arms can transport three pieces of material in a single step.

The deadlock determination device may be configured to determine whether the deadlock has occurred during the scheduling of the semiconductor apparatus by using the deadlock determination methods of embodiments of the present disclosure. In some embodiments, the deadlock determination device may be integrated into the scheduling system of the semiconductor apparatus.

The semiconductor apparatus provided by the present disclosure may transport a plurality of pieces of material in a single step and determine whether the deadlock has occurred.

Above embodiments are merely exemplary embodiments for describing the principle of the present disclosure. The present disclosure is not limited to this. Those of ordinary skill in the art may make various variations and improvements without departing from the spirit and essence of the present disclosure. These variations and improvements are within the scope of the present disclosure.

What is claimed is:

1. A deadlock determination method, comprising:
   constructing a new wait relation graph (WRG), wherein:
      at least one process step that includes a plurality of resources being selected from process steps in a WRG that supports transporting a single piece of material;
      the plurality of resources corresponding to the at least one process step are combined; and
      a total capacity of each of the process steps is changed according to a combination result to construct the new WRG that supports transporting a plurality of pieces of material; and
   determining a deadlock, including determining whether a material scheduling deadlock occurs based on the new WRG;
   wherein:
      the plurality of resources include apparatuses for performing the process steps; and
      the total capacity is a sum of a number of workstations of resources corresponding to each process step.

2. The deadlock determination method according to claim 1, wherein constructing a new WRG includes:
   combining a number R of resources corresponding to the selected process step into one resource; and
   changing the total capacity of the process step to cause $C_{new}=C_{old}/R$;
   wherein:
      R is a number of the resources corresponding to the process step, and R is an integer greater than or equal to 2;
      $C_{new}$ is the total capacity of the process step after the resources are combined; and
      $C_{old}$ is the total capacity of the process step before the resources are combined.

3. The deadlock determination method according to claim 2, wherein determining the deadlock includes:
   obtaining simple loops from the new WRG;
   obtaining selection loops from the new WRG to form a selection loop collection, an attribute flag of the selection loops is non-Broken;
   determining whether attribute flags of the simple loops are Broken or non-Broken;
   forming simple loops with the attribute flag of non-Broken and the selection loops into a first loop collection;
   grouping a number M of loops in the first loop collection to form a second loop collection including a number N of loops, $N=C_M^1+C_M^2+\ldots+C_M^M$;
   determining whether a loop in the second loop collection includes another loop:
      in response to in the second loop collection including another loop, deleting the another loop included, forming loops in the second loop collection that are not deleted into a third loop collection;
   obtaining a number of vacant workstations or the resources and a total number of nodes based on loop information in the third loop collection, in a plurality of loops that are connected to each other, one workstation being included in a resource at a connection, and the connection being a node; and calculating a difference between the number of vacant workstations and the total number of the nodes and determining whether the difference is greater than zero:
in response to the difference being greater than zero, determining that the material scheduling deadlock has not occurred; and
in response to the difference being smaller than or equal to zero, determining that the material scheduling deadlock has occurred.

4. The deadlock determination method according to claim 3, further comprising, after determining the deadlock:
in response to the material scheduling deadlock occurring, ending a process; and
in response to the material scheduling deadlock not occurring, simulating moving the piece of material from the current process step to the next process step, and returning to determining whether the current status of the piece of material matches the situation that requires the material scheduling deadlock determination.

5. The deadlock determination method according to claim 2, wherein:
in the WRG that supports transporting the single piece of material, the process steps include:
a first step, resources of the first step including an atmosphere transport robot (ATR) that transports two pieces of material simultaneously, and a total capacity of the first step being two;
a second step, resources of the second step including two chamber groups, each of the two chamber groups including two loadlock (LL) chambers, and a total capacity of the second step being four;
a third step, resources of the third step including a vacuum transportation robot (VTR) that transports four pieces of material simultaneously, and a total capacity of the third step being four; and
a fourth step, resources of the fourth step including a reaction chamber, and a total capacity of the fourth step being two; and
constructing the new WRG includes:
combining two resources corresponding to the second step into one resource in the WRG that supports transporting the single piece of material;
changing the total capacity of the first step to 1;
changing the total capacity of the second step to 2;
changing the total capacity of the third step to 2; and
changing the total capacity of the fourth step to 1.

6. The deadlock determination method according to claim 2, wherein:
in the WRG that supports transporting the single piece of material, the process steps include:
a first step, resources of the first step including an ATR that transports three pieces of material simultaneously, and a total capacity of the first step being three;
a second step, resources of the second step including three chamber groups, each of the three chamber groups including two LL chambers, and a total capacity of the second step being six;
a third step, resources of the third step including a VTR that transports three pieces of material simultaneously, and a total capacity of the third step being three; and
a fourth step, resources of the fourth step including a reaction chamber, and a total capacity of the fourth step being three; and constructing the new WRG includes:
combining three resources corresponding to the second step in the WRG that supports transporting the single piece of material into one resource;
changing the total capacity of the first step to 1;
changing the total capacity of the second step to 2;
changing the total capacity of the third step to 1; and
changing the total capacity of the fourth step to 1.

7. The deadlock determination method according to claim 1, further comprising, after constructing the new WRG, and before determining the deadlock:
determining whether a current status of the piece of material matches a situation that requires material scheduling deadlock determination;
in response to the current status matching the situation, determining the deadlock; and
in response to the current status not matching the situation, simulating moving the piece of material from a current process step to a next process step and determining the deadlock.

8. The deadlock determination method according to claim 1, wherein determining the deadlock includes:
obtaining simple loops from the new WRG;
obtaining selection loops from the new WRG to form a selection loop collection, an attribute flag of the selection loops is non-Broken;
determining whether attribute flags of the simple loops are Broken or non-Broken;
forming simple loops with the attribute flag of non-Broken and the selection loops into a first loop collection;
grouping a number M of loops in the first loop collection to form a second loop collection including a number N of loops, $N=C_M^1+C_M^2+\ldots+C_M^M$;
determining whether a loop in the second loop collection includes another loop:
in response to in the second loop collection including another loop, deleting the another loop included, forming loops in the second loop collection that are not deleted into a third loop collection;
obtaining a number of vacant workstations or the resources and a total number of nodes based on loop information in the third loop collection, in a plurality of loops that are connected to each other, one workstation being included in a resource at a connection, and the connection being a node; and
calculating a difference between the number of vacant workstations and the total number of the nodes and determining whether the difference is greater than zero:
in response to the difference being greater than zero, determining that the material scheduling deadlock has not occurred; and
in response to the difference being smaller than or equal to zero, determining that the material scheduling deadlock has occurred.

9. The semiconductor apparatus according to claim 8, wherein:
a number N of LL chambers are included;
each of the number N of LL chambers includes a workstation;
each two of the number N of LL chambers form a chamber group;
N is an even number greater than or equal to 4;
the ATR includes a number N/2 of arms, each of the number N/2 of arms transporting a piece of material in a single step;

the ATR simultaneously transports pieces of material to one LL chamber of a number N/2 chamber groups;
the VTR includes two arms, each of the two arms transports a number N/2 of pieces of material in a single step; and
at least one reaction chamber is included, and each reaction chamber includes a number N/2 of workstations.

10. The semiconductor apparatus according to claim 8, wherein the deadlock determination device is further configured to:
combine a number R of resources corresponding to the selected process step into one resource; and
change the total capacity of the process step to cause $C_{new}=C_{old}/R$;
wherein:
R is a number of the resources corresponding to the process step, and R is an integer greater than or equal to 2;
$C_{new}$ is the total capacity of the process step after the resources are combined; and
$C_{old}$ is the total capacity of the process step before the resources are combined.

11. The semiconductor apparatus according to claim 8, wherein the deadlock determination device is further configured to, after the new WRG is constructed, and before the deadlock is determined:
determine whether a current status of the piece of material matches a situation that requires to perform material scheduling deadlock determination;
in response to the current status matching the situation, determine the deadlock; and
in response to the current status not matching the situation, simulate moving the piece of material to cause a current process step to move to a next process step and determining the deadlock.

12. The semiconductor apparatus according to claim 9, wherein the deadlock determination device is further configured to, after the deadlock is determined:
in response to the material scheduling deadlock occurring, end a process; and
in response to the material scheduling deadlock not occurring, simulate moving the piece of material to cause the current process step to move to the next process step, and return to determining whether the current status of the piece of material matches the situation that requires to perform the material scheduling deadlock determination.

13. The semiconductor apparatus according to claim 8, wherein the deadlock determination device is further configured to:
obtain simple loops from the new WRG;
obtain selection loops from the new WRG to form a selection loop collection, an attribute flag of the selection loops is non-Broken;
determine whether attribute flags of the simple loops are Broken or non-Broken;
form simple loops with the attribute flag of non-Broken and the selection loops into a first loop collection;
group a number M of loops in the first loop collection to form a second loop collection including a number N of loops, $N=C_M^1+C_M^2+\ldots+C_M^M$;
determine whether a situation exists that a loop in the second loop collection includes another loop:
in response to the situation existing, deleting the another loop included, form loops in the second loop collection that are not deleted into a third loop collection;
obtain a number of vacant workstations or the resources and a total number of nodes based on loop information in the third loop collection, in a plurality of loops that are connected to each other, one workstation being included in a resource at a connection, and the connection being a node; and
calculate a difference between the number of vacant workstations and the total number of the nodes and determine whether the difference is greater than zero, wherein:
in response to the difference being greater than zero, the material scheduling deadlock does not occur; and
in response to the difference being smaller than or equal to zero, the material scheduling deadlock occurs.

14. The semiconductor apparatus according to claim 8, wherein:
in the WRG that supports transporting the single piece of material, the process steps include:
a first step, resources of the first step including an atmosphere transport robot (ATR) that transports two pieces of material simultaneously, and a total capacity of the first step being two;
a second step, resources of the second step including two chamber groups, each of the two chamber groups including two loadlock (LL) chambers, and a total capacity of the second step being four;
a third step, resources of the third step including a vacuum transportation robot (VTR) that transports four pieces of material simultaneously, and a total capacity of the third step being four; and
a fourth step, resources of the fourth step including a reaction chamber, and a total capacity of the fourth step being two; and
the deadlock determination device is further configured to:
combine two resources corresponding to the second step in the WRG that supports transporting the single piece of material into one resource;
change the total capacity of the first step to 1;
change the total capacity of the second step to 2;
change the total capacity of the third step to 2; and
change the total capacity of the fourth step to 1.

15. The semiconductor apparatus according to claim 8, wherein:
in the WRG that supports transporting the single piece of material, the process steps include:
a first step, resources of the first step including an ATR that transports three pieces of material simultaneously, and a total capacity of the first step being three;
a second step, resources of the second step including three chamber groups, each of the three chamber groups including two LL chambers, and a total capacity of the second step being six;
a third step, resources of the third step including a VTR that transports three pieces of material simultaneously, and a total capacity of the third step being three; and
a fourth step, resources of the fourth step including a reaction chamber, and a total capacity of the fourth step being three; and
the deadlock determination device is further configured to:

combine three resources corresponding to the second step in the WRG that supports transporting the single piece of material into one resource;
change the total capacity of the first step to 1;
change the total capacity of the second step to 2;
change the total capacity of the third step to 1; and
change the total capacity of the fourth step to 1.

16. The deadlock determination method according to claim 1, wherein:
in the WRG that supports transporting the single piece of material, the process steps include:
a first step, resources of the first step including an atmosphere transport robot (ATR) that transports two pieces of material simultaneously, and a total capacity of the first step being two;
a second step, resources of the second step including two chamber groups, each of the two chamber groups including two loadlock (LL) chambers, and a total capacity of the second step being four;
a third step, resources of the third step including a vacuum transportation robot (VTR) that transports four pieces of material simultaneously, and a total capacity of the third step being four; and
a fourth step, resources of the fourth step including a reaction chamber, and a total capacity of the fourth step being two; and
constructing the new WRG includes:
combining two resources corresponding to the second step into one resource in the WRG that supports transporting the single piece of material;
changing the total capacity of the first step to 1;
changing the total capacity of the second step to 2;
changing the total capacity of the third step to 2; and
changing the total capacity of the fourth step to 1.

17. The semiconductor apparatus according to claim 16, wherein N is equal to 4 or 6.

18. The deadlock determination method according to claim 1, wherein:
in the WRG that supports transporting the single piece of material, the process steps include:
a first step, resources of the first step including an ATR that transports three pieces of material simultaneously, and a total capacity of the first step being three;
a second step, resources of the second step including three chamber groups, each of the three chamber groups including two LL chambers, and a total capacity of the second step being six;
a third step, resources of the third step including a VTR that transports three pieces of material simultaneously, and a total capacity of the third step being three; and
a fourth step, resources of the fourth step including a reaction chamber, and a total capacity of the fourth step being three; and
constructing the new WRG includes:
combining three resources corresponding to the second step in the WRG that supports transporting the single piece of material into one resource;
changing the total capacity of the first step to 1;
changing the total capacity of the second step to 2;
changing the total capacity of the third step to 1; and
changing the total capacity of the fourth step to 1.

19. A semiconductor apparatus, comprising:
a loadport;
an LL chamber;
a process chamber;
an ATR, configured to transport a piece of material between the loadport and the LL chamber and transport at least one piece of material in a single step;
a VTR, configured to transport the piece of material between the LL chamber and the process chamber and transport at least one piece of material in a single step;
a deadlock determination device, configured to:
construct a new WRG, wherein:
at least one process step that includes a plurality of resources is selected from process steps in a WRG that supports transporting a single piece of material;
the plurality of resources corresponding to the at least one process step are combined; and
a total capacity of each of the process steps is changed according to a combination result to construct the new WRG that supports transporting a plurality of pieces of material; and
determine a deadlock, whether a piece of material scheduling deadlock occurs being determined based on the new WRG;
wherein:
the plurality of resources include apparatuses for performing the process steps; and
the total capacity is a sum of a number of workstations of resources corresponding to each process step.

* * * * *